(12) United States Patent
Zhang et al.

(10) Patent No.: US 11,895,802 B2
(45) Date of Patent: Feb. 6, 2024

(54) COMPUTATIONAL HEAT DISSIPATION STRUCTURE, COMPUTING DEVICE COMPRISING SAME, MINE

(71) Applicant: Canaan Creative Co., LTD., Beijing (CN)

(72) Inventors: Ning Zhang, Beijing (CN); Nangeng Zhang, Beijing (CN)

(73) Assignee: Canaan Creative Co., LTD., Beijing (CN)

( * ) Notice: Subject to any disclaimer, the term of this patent is extended or adjusted under 35 U.S.C. 154(b) by 0 days.

(21) Appl. No.: 17/872,172

(22) Filed: Jul. 25, 2022

(65) Prior Publication Data

US 2022/0361363 A1    Nov. 10, 2022

Related U.S. Application Data

(63) Continuation of application No. 16/614,054, filed as application No. PCT/CN2018/083956 on Apr. 20, 2018, now Pat. No. 11,425,839.

(30) Foreign Application Priority Data

May 18, 2017 (CN) .......................... 201710353744.5

(51) Int. Cl.
*H05K 7/20* (2006.01)
*G06F 1/20* (2006.01)
*F04D 27/00* (2006.01)

(52) U.S. Cl.
CPC ....... *H05K 7/20154* (2013.01); *F04D 27/004* (2013.01); *G06F 1/206* (2013.01); *H05K 7/20145* (2013.01); *H05K 7/20518* (2013.01)

(58) Field of Classification Search
CPC . G06F 1/20; G06F 1/183; G06F 1/203; G06F 1/188; G06F 1/206; H05K 1/0203; H05K 7/2039; H05K 1/181; H05K 7/20154; H05K 7/20145; H05K 7/20518; H05K 7/20709; H05K 1/0201; H05K 7/20136
See application file for complete search history.

(56) References Cited

U.S. PATENT DOCUMENTS

| | | | |
|---|---|---|---|
| 6,212,074 B1 * | 4/2001 | Gonsalves | .......... H01L 23/4275 174/16.3 |
| 6,259,600 B1 | 7/2001 | Talbot et al. | |
| 6,437,979 B1 | 8/2002 | Unrein | |
| 6,477,051 B1 * | 11/2002 | Barsun | ................ H01L 21/4871 361/720 |

(Continued)

*Primary Examiner* — Adam B Dravininkas

(57) ABSTRACT

A computational heat dissipation structure includes a circuit board including a plurality of heating components; and a radiator provided corresponding to the circuit board; wherein a space between the adjacent heating components is negatively correlated with heat dissipation efficiency of a region where the adjacent heating components are located. Since the space between the adjacent heating components of the disclosure is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the heat dissipation efficiencies corresponding to the heating components are balanced, and load of a fan is reduced.

55 Claims, 10 Drawing Sheets

(56) References Cited

U.S. PATENT DOCUMENTS

| | | |
|---|---|---|
| 6,580,611 B1 | 6/2003 | Vandentop et al. |
| 10,820,405 B1 | 10/2020 | Narasimhan |
| 2003/0218850 A1* | 11/2003 | Kubo .................... H01L 23/467 |
| | | 361/103 |
| 2005/0128710 A1 | 6/2005 | Beitelmal et al. |
| 2006/0104025 A1 | 5/2006 | Wabiszczewicz |
| 2006/0267192 A1 | 11/2006 | Chen |
| 2007/0045801 A1 | 3/2007 | Sugiyama et al. |
| 2007/0091578 A1* | 4/2007 | Chang ................. H01L 23/3677 |
| | | 257/E23.105 |
| 2008/0023189 A1 | 1/2008 | Kimura et al. |
| 2008/0043433 A1 | 2/2008 | Joshi et al. |
| 2008/0151501 A1* | 6/2008 | Takasou ............. H05K 7/20154 |
| | | 361/697 |
| 2008/0158818 A1 | 7/2008 | Clidaras et al. |
| 2009/0255659 A1* | 10/2009 | Xu ........................ H01L 23/367 |
| | | 165/185 |
| 2011/0292596 A1* | 12/2011 | El-Essawy ............... H05K 7/20 |
| | | 361/679.54 |
| 2012/0250323 A1* | 10/2012 | Velu ........................ F21V 29/00 |
| | | 257/E33.056 |
| 2013/0112373 A1 | 5/2013 | Fukai et al. |
| 2013/0188315 A1 | 7/2013 | Konishide et al. |
| 2014/0362576 A1* | 12/2014 | Degner ................ H05K 1/0203 |
| | | 362/253 |
| 2015/0245533 A1 | 8/2015 | Wright et al. |
| 2016/0278236 A1 | 9/2016 | Mitsui |

\* cited by examiner

COMPUTATIONAL HEAT DISSIPATION STRUCTURE, COMPUTING DEVICE COMPRISING SAME, MINE

CROSS REFERENCE TO RELATED APPLICATION

This application is a continuation application of U.S. patent application Ser. No. 16/614,054 filed on Nov. 15, 2019, which is a national phase application of International Application No. PCT/CN2018/083956, filed with the China National Intellectual Property Administration (CNIPA) on Apr. 20, 2018. International Application No. PCT/CN2018/083956 claims priority to and benefits of Chinese Patent Application No. 201710353744.5, filed with the CNIPA on May 18, 2017. The entire contents of all of the above-identified applications are incorporated herein by reference.

BACKGROUND OF THE INVENTION

1. Field of the Invention

The disclosure relates to heat dissipation, and specifically to a computing device and a computational heat dissipation structure thereof. The disclosure further relates to a mine formed of a plurality of the computing devices.

2. Related Art

In modern computing devices, component integration becomes higher, the number of components deployed on the devices is also increasing, and during operation of the device, the heat generated is also increasing. In a high temperature environment, poor heat dissipation of the components, or uneven heat dissipation of the components at different positions will cause working instability, reduced performance, and shorter working life of the entire circuit. Therefore, the modern computing device has a high requirement for heat dissipation.

Currently, the heat dissipation method is air cooling. Radiators made of a material with high thermal conductive efficiency are mounted on the high heating components, and then active heat dissipation is carried out through a fan. For example, the Chinese patent for utility model No. ZL201520353408.7 discloses a chip heat dissipation device, a virtual digital coin digger and a computing device, wherein the chip heat dissipation device comprises a chip welded onto a front of a printed circuit board, a first radiator connected to a top of the chip for dissipating heat, and a second radiator connected to a back of the printed circuit board and a part corresponding to a bottom of the chip for dissipating heat, and a fan is located on both sides of a case of the virtual digital coin digger to take away heat generated by the chip in working, and ensure normal working of the digger.

However, in the prior art, since the chip components are deployed on the circuit board in an equal space, and positions relative to the air duct are different, a temperature difference between an air inlet and an air outlet is relatively large, and a temperature equalization effect is poor. On such basis, air flowing speed is often increased by increasing rotation speed of the fan, thereby ensuring that the temperature in the hottest region satisfies use requirement, but such method also increases load of the fan.

SUMMARY OF THE INVENTION

The technical problem to be solved by the disclosure is to provide a computational heat dissipation structure, and a computing device comprising same, and a mine that can balance heat dissipation efficiencies corresponding to respective heating components, and reduce load of a fan.

To solve the above technical problem, the computational heat dissipation structure of the disclosure comprises a circuit board comprising a plurality of heating components; and a radiator provided corresponding to the circuit board; wherein a space between the adjacent heating components is negatively correlated with heat dissipation efficiency of a region where the adjacent heating components are located.

In one embodiment of the computational heat dissipation structure, the circuit board comprises a first side face and a second side face, wherein when the circuit board is in a working state, an output heat of the first side face is larger than that of the second side face.

In one embodiment of the computational heat dissipation structure, the radiator comprises a main heat sink carrying the circuit board; and an auxiliary heat sink pressing the circuit board against the main heat sink tightly.

In one embodiment of the computational heat dissipation structure, the auxiliary heat sink presses the circuit board against the main heat sink by way of resilient press.

In one embodiment of the computational heat dissipation structure, a thermal conductive material is filled in a gap between the auxiliary heat sink and the circuit board.

In one embodiment of the computational heat dissipation structure, the thermal conductive material is thermal conductive silicone grease or thermal conductive rubber pad.

In one embodiment of the computational heat dissipation structure, heat dissipation efficiency of the main heat sink is higher than that of the auxiliary heat sink, the main heat sink is provided corresponding to the first side face, and the auxiliary heat sink is provided corresponding to the second side face.

In one embodiment of the computational heat dissipation structure, the main heat sink comprises a first heat dissipation body comprising a first surface and a second surface; and a first heat dissipation fin, wherein the first surface is connected to the first heat dissipation fin, and wherein the second surface is connected to the first side face. The auxiliary heat sink comprises a second heat dissipation body comprising a third surface and a fourth surface; and a second heat dissipation fin, wherein the third surface is connected to the second heat dissipation fin, and wherein the fourth surface is connected to the second side face.

In one embodiment of the computational heat dissipation structure, there is a plurality of the auxiliary heat sink, each corresponding to one or more of the heating components.

The computing device of the disclosure comprises a device housing enclosing an enclosed heat-dissipation air duct, and further comprising the above computational heat dissipation structure, wherein the computational heat dissipation structure is located in the heat-dissipation air duct.

In one embodiment of the computing device, a temperature detecting unit for measuring a temperature in the heat-dissipation air duct is mounted within the heat-dissipation air duct.

In one embodiment of the computing device, it further comprises a controller comprising a fan control module; and a fan, the temperature detecting unit and the fan respectively electrically connected to the fan control module; wherein the fan control module adjusts dynamically a rotation speed of the fan based on a real-time temperature in the heat-dissipation air duct detected by the temperature detecting unit.

In one embodiment of the computing device, the heat-dissipation air duct comprises an air inlet mounted with a first panel assembly; and an air outlet mounted with a second panel assembly; wherein the first panel assembly and the second panel assembly fix the radiator within the heat-dissipation air duct.

In one embodiment of the computing device, the fan comprises a first fan provided at the air inlet and connected to the first panel assembly.

In one embodiment of the computing device, the fan comprises a second fan provided at the air outlet and connected to the second panel assembly.

In one embodiment of the computing device, the heat-dissipation air duct comprises a plurality of temperature zones, and wherein there is a plurality of the temperature detecting unit, each being provided in respective temperature zones.

In one embodiment of the computing device, the controller further comprises a chip control module electrically connected to respective temperature detecting units, wherein the chip control module adjusts dynamically working frequencies of the heating components in respective temperature zones based on real-time temperature of the temperature zone detected by respective temperature detecting unit.

In one embodiment of the computing device, there is at least one the computational heat dissipation structure.

The mine of the disclosure comprises at least one setting frame provided with at least one computing device, wherein the computing device is the above computing device.

As compared to the prior art, the disclosure has the following advantages: since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the computational heat dissipation structure and the computing device provided by the disclosure balance the heat dissipation efficiencies corresponding to respective heating components, and reduce load of the fan. Therefore, the mine provided by the disclosure avoids the problem of overheating damage of the heating components even if a large number of computing devices are gathered in the same space.

Further, the disclosure dynamically controls efficiency of the fan and working frequencies of the heating components within different temperature zones, further balance the heat dissipation efficiencies of different regions in the heat-dissipation air duct, and improve service life of the heating components, entire circuit and fan through temperature data fed back by the temperature detecting units.

Hereinafter the disclosure is explicitly described with reference to the drawings and the detailed embodiments, but the disclosure is not limited thereto.

PREFERABLE EMBODIMENTS OF THE INVENTION

Hereinafter the technical solution of the disclosure is explicitly described with reference to the drawings and the detailed embodiments to further understand object, solution and effect of the disclosure, instead of limiting the scope protected by the appended claims of the disclosure.

The disclosure discloses one or more embodiments containing characteristics of the disclosure. The disclosed embodiments are only for exemplary explanation. The scope protected by the disclosure is not limited to the disclosed embodiments. The disclosure is defined by the appended claims.

References of "one embodiment", "an embodiment" and "exemplary embodiment" in the specification refer to that the described embodiment can comprise specific features, structures or characteristics, but not every embodiment must comprise these specific features, structures or characteristics. In addition, such expression does not refer to the same embodiment. Further, when the specific feature, structure or characteristic is described with reference to the embodiments, no matter whether it is clearly described, it has shown that combination of such specific feature, structure or characteristic with other embodiments is within the knowledge range of those skilled in the art.

The specification and subsequent claims use some phrases to refer to specific components or members, those ordinary in the art shall understand that technology users or manufacturers can use different nouns or terms to call the same component or member. The specification and subsequent claims do not distinguish the components or members by different names, but distinguishing based on functional differences of the components or members as a criterion. "Comprising" and "including" mentioned in the whole specification and subsequent claims are open phrases, and shall be understood as "include but not limited to". In addition, the word "connection" here includes any direct or indirectly electrical connection means. Indirect electrical connection means comprises connection through other device.

It shall be noted that terms of "transverse", "vertical", "up", "down", "front", "back", "left", "right", "upright", "horizontal", "top", "bottom", "in", and "out" indicating orientation or position relations in the disclosure are orientation or position relations based on the drawings in order to facilitate describing the disclosure and simplifying description only, rather than indicating or suggesting that the referred device or element must have a specific orientation, and structured and operated in a specific orientation, so they cannot be understood as limitations to the disclosure.

Figure 1:
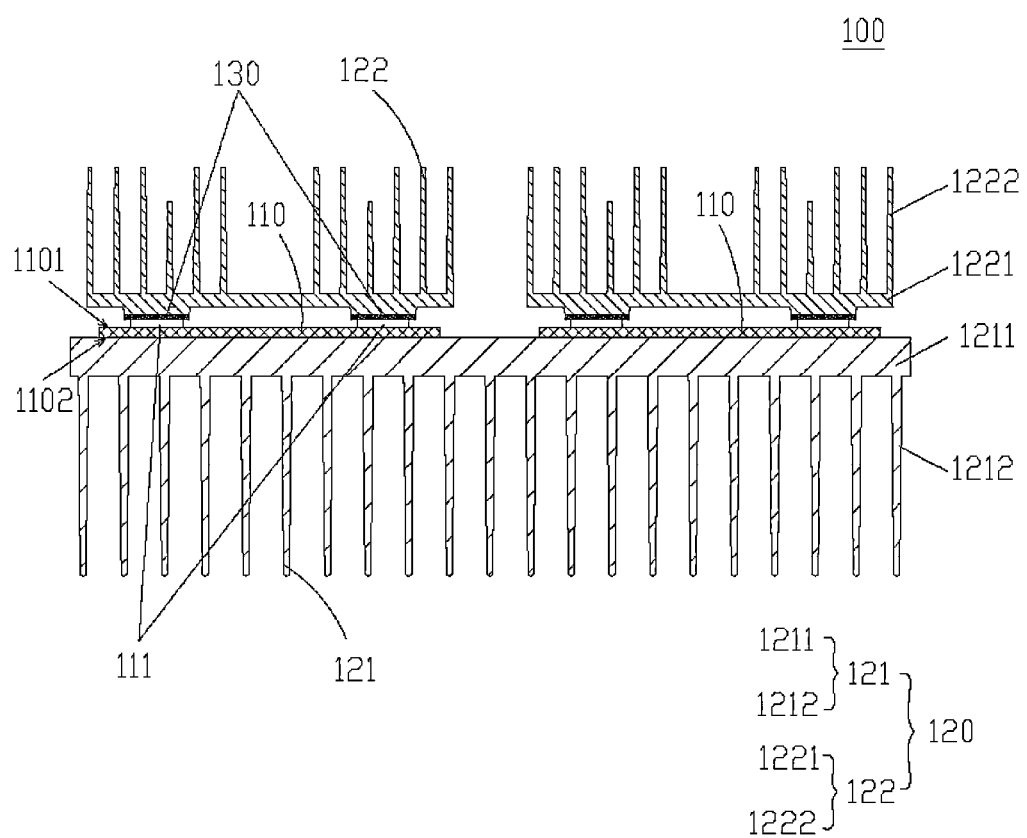
FIG. 1 is a structure diagram of a computational heat dissipation structure according to one embodiment of the disclosure.
Figure 5:
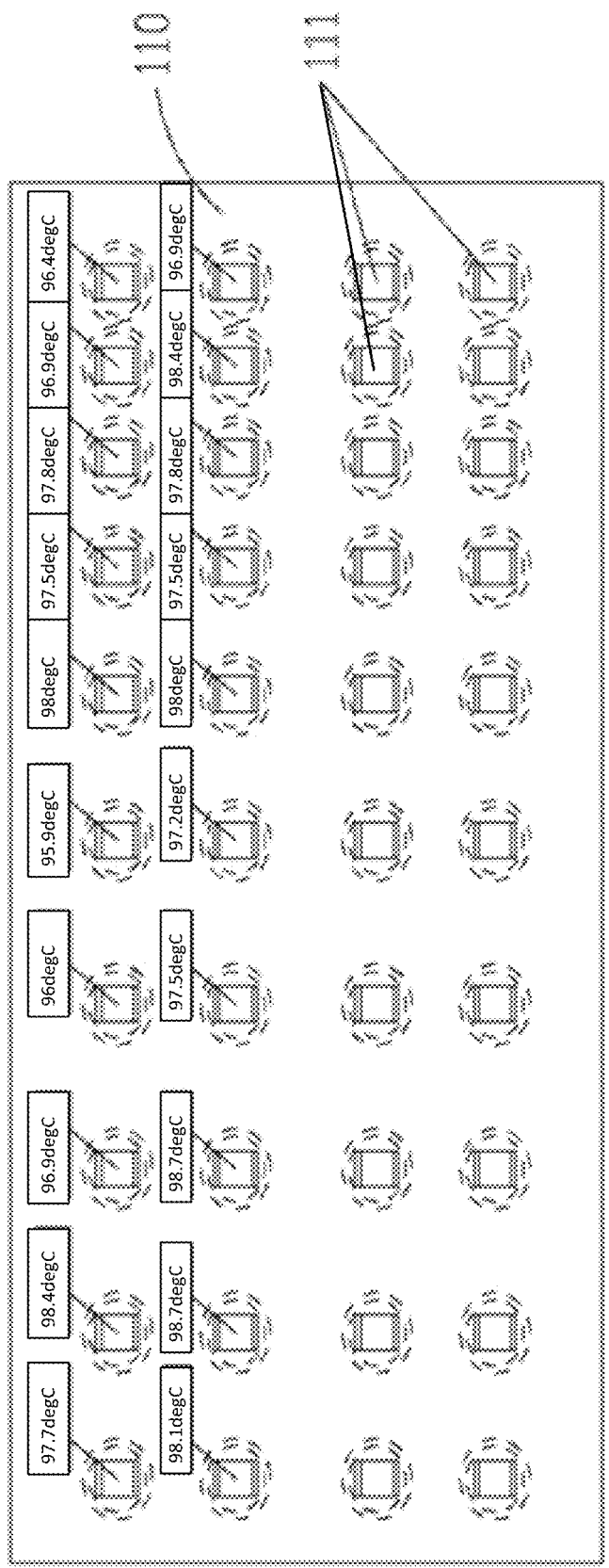
FIG. 5 is a deployment diagram of heating components on a circuit board in the disclosure.

FIG. 1 is a structure diagram of a computational heat dissipation structure according to one embodiment of the disclosure. As shown in FIG. 1 and FIG. 5, the computational heat dissipation structure 100 comprises a circuit board 110 comprising a plurality of heating components 111, and a radiator 120, wherein a space between the adjacent heating components 111 is negatively correlated with heat dissipation efficiency of a region where the adjacent heating components 111 are located.

Figure 2:
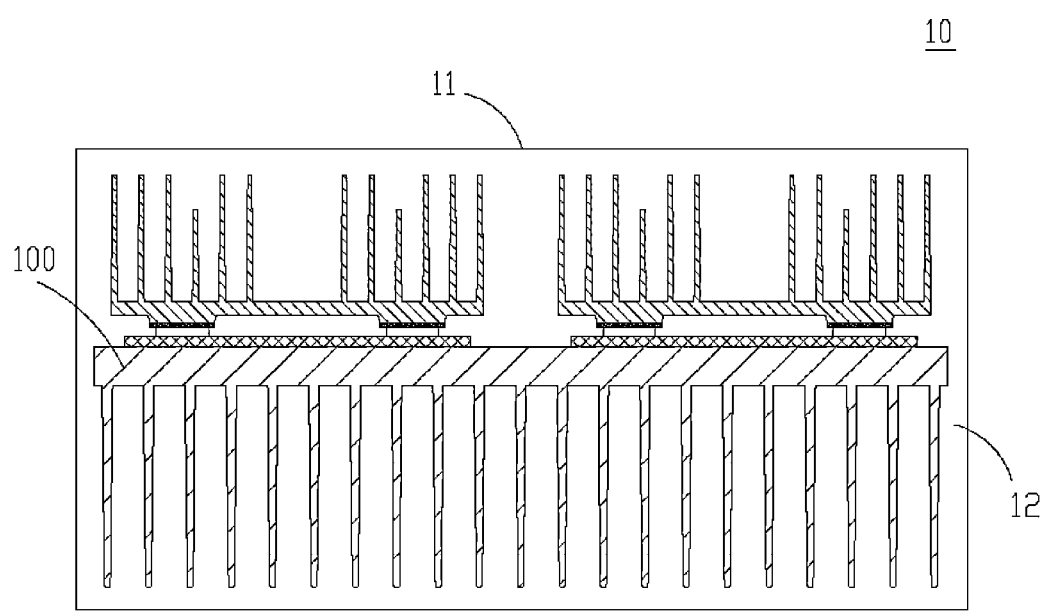
FIG. 2 is a structure diagram of a computing device according to one embodiment of the disclosure.

FIG. 2 is a structure diagram of a computing device according to one embodiment of the disclosure, wherein the computing device comprises the computational heat dissipation structure illustrated in FIG. 1.

As shown in FIG. 2, the computing device 10 comprises a device housing 11 enclosing an enclosed heat-dissipation air duct 12, and the computational heat dissipation structure 100, wherein the computational heat dissipation structure 100 is located in the heat-dissipation air duct 12.

Figure 3:
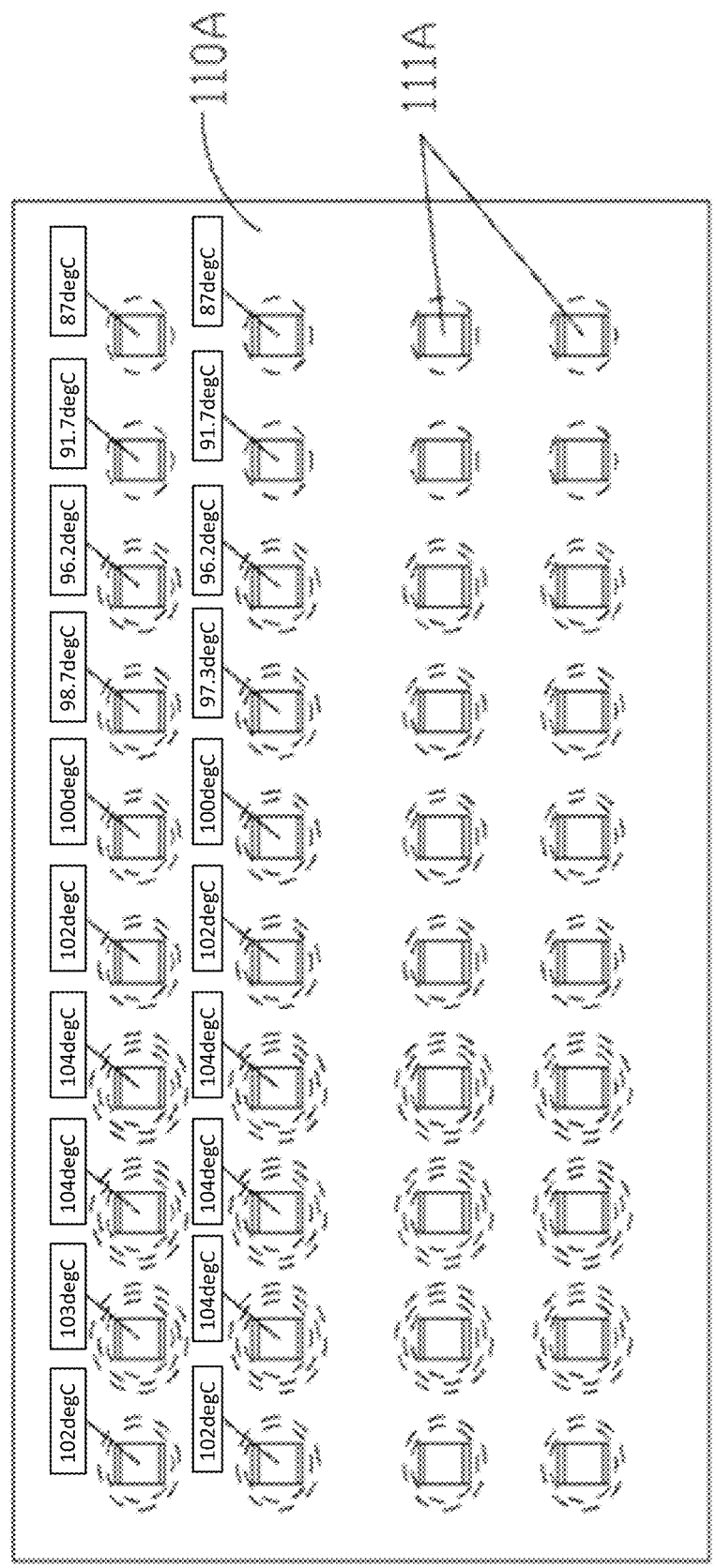
FIG. 3 is a deployment diagram of heating components on a circuit board in the prior art.
Figure 4:
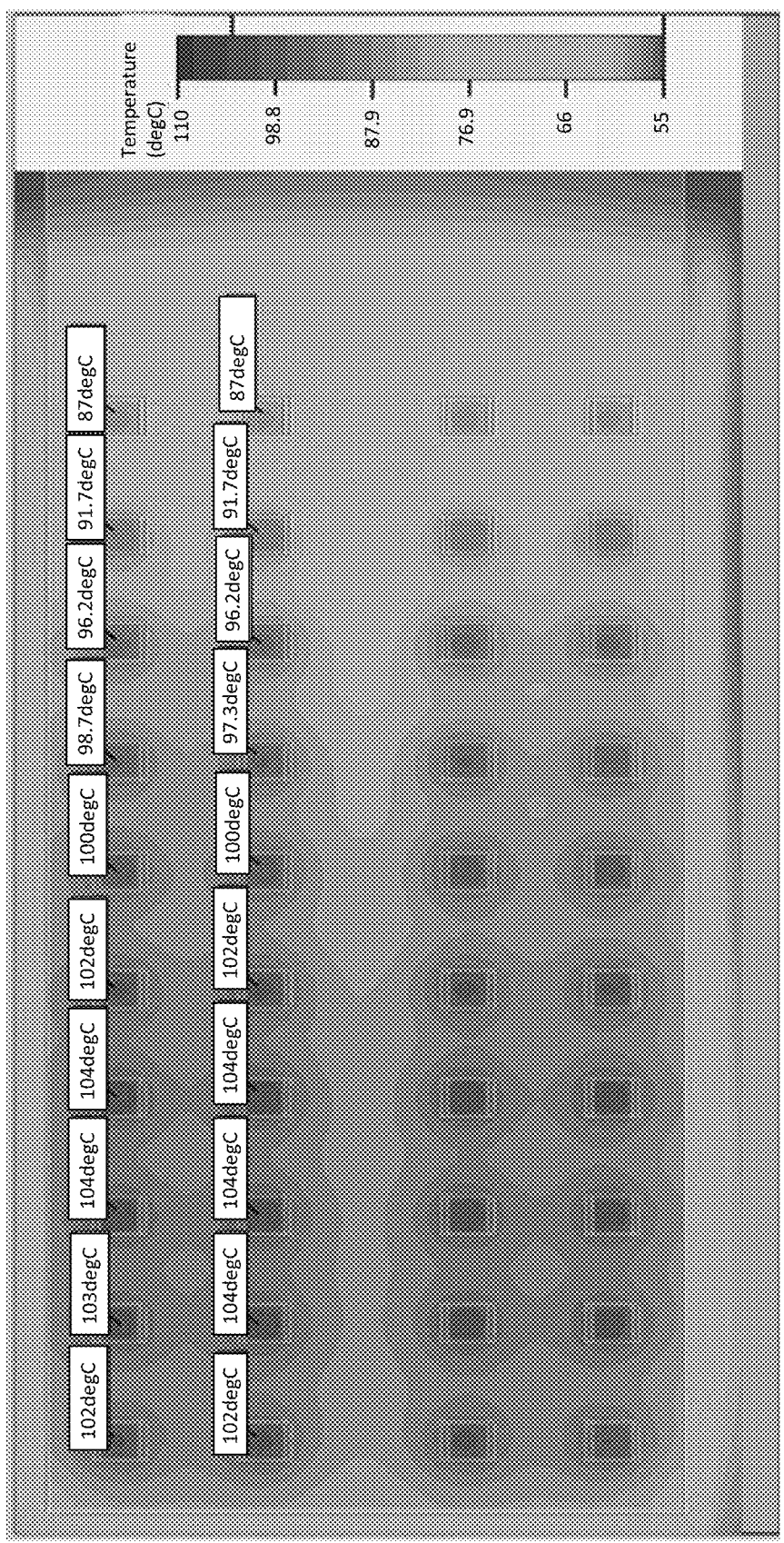
FIG. 4 is a working effect diagram of the heating components on the circuit board of FIG. 3.

FIGS. 3 and 4 are deployment diagrams of heating components on a circuit board in the prior art. As shown in the figures, a left side of the circuit board 110A is close to an air outlet, and a right side is close to an air inlet. As shown in FIG. 3, a plurality of heating components 111A deployed on the device are equally spaced, while a temperature difference between the air outlet and the air inlet is relatively large. Referring to FIGS. 3 and 4, the temperature of the heating component at the air inlet is 87 deg. C., while at a position closer to the air outlet the maximum temperature has reached 104 deg. C. As can be seen, heat dissipation of the heating components 111A is uneven. When temperatures of some heating components 111A are too high due to low heat dissipation efficiency, it might cause working instability, shorter working life and reduced performance of the entire circuit.

Figure 6:
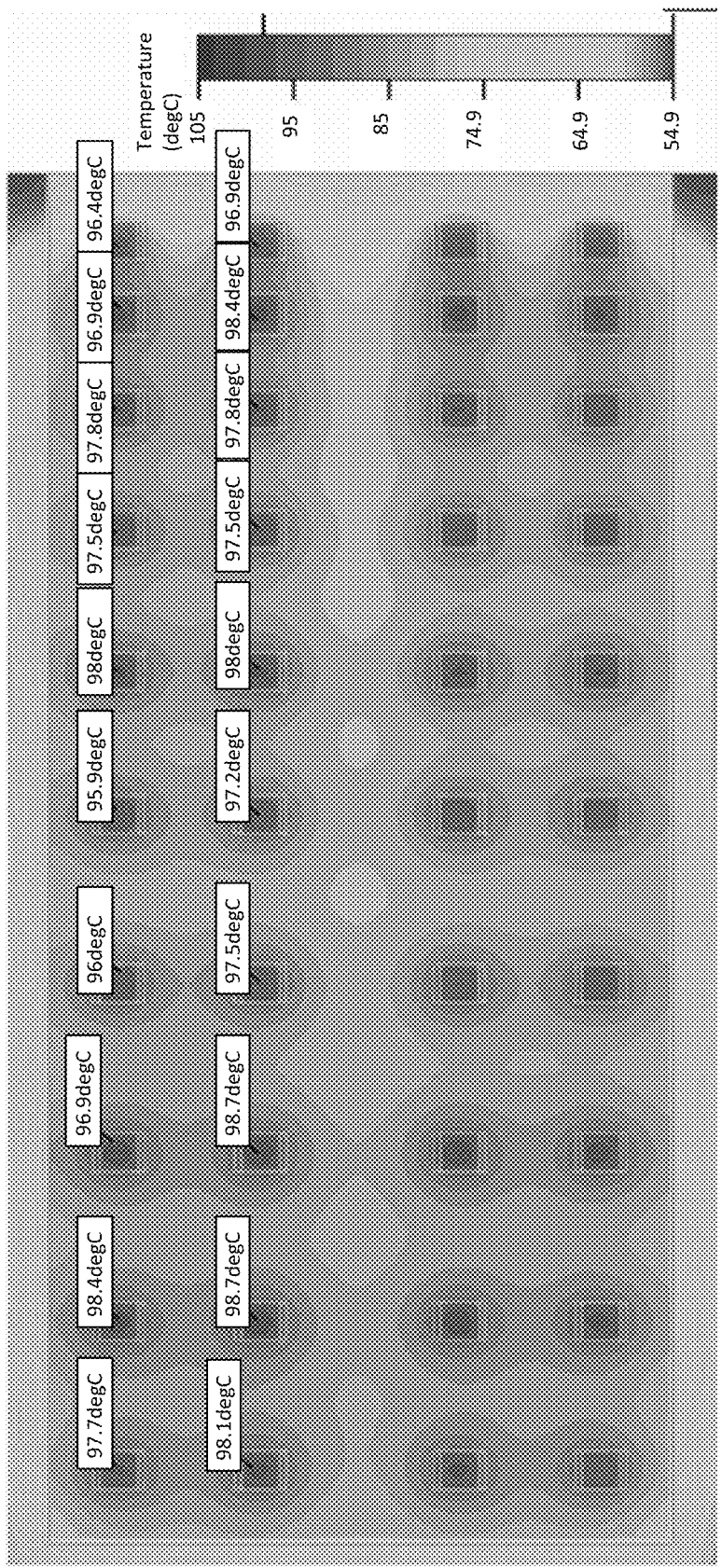
FIG. 6 is a working effect diagram of the heating components on the circuit board of FIG. 5.

FIGS. 5 and 6 are deployment diagrams of heating components on a circuit board of the computing device in the disclosure. As shown in FIGS. 5 and 6, a left side of the circuit board 110 provided in the disclosure is close to an air outlet, and a right side is close to an air inlet. As shown in the figures, the circuit board 110 is deployed with a plurality of heating components 111, while these heating components 111 are not equally spaced, and a space between the adjacent heating components is negatively correlated with heat dissipation efficiency of a region where the adjacent heating components are located. Therefore, if the space between the adjacent heating components at the air inlet is small, the space between the adjacent heating components at the air outlet is large, so that temperatures of respective heating components on the circuit board can be balanced.

As can be seen from the figures, the computational heat dissipation structure deployed with the unequally spaced heating components provided in the disclosure has a maximum temperature of 98.7 deg. C., and a minimum temperature of 95.9 deg. C. with the same rotation speed of the fan as the structure deployed with the equally spaced heating components as shown in FIGS. 3 and 4. As can be seen, with the same rotation speed of the fan, the structure deployed with the unequally spaced heating components provided by the disclosure enables temperatures of the heat dissipation components in respective regions to keep substantially balanced.

The deployed space of the heating components in respective regions of the circuit board in this embodiment can be obtained through a large number of simulation experiments.

The advantageous effect of the disclosure lies in: since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the heat dissipation efficiencies corresponding to the heating components are balanced, and load of the fan is reduced.

In one embodiment, as shown in FIG. 1, the circuit board 110 of the computational heat dissipation structure 100 comprises a first side face 1101 and a second side face 1102.

In one embodiment, as shown in FIG. 1, the radiator 120 comprises a main heat sink 121 and an auxiliary heat sink 122, wherein the heat dissipation efficiency of the main heat sink 121 is higher than that of the auxiliary heat sink 122.

In this embodiment, the main heat sink 121 carries the circuit board 110, which can function to dissipate heat, and also function to support the air duct structure, so it functions to dissipate heat and support simultaneously.

The auxiliary heat sink 122 presses the circuit board 110 against the main heat sink 121, which can function to dissipate heat, and also function to fix the circuit board 110.

The advantageous effect of this embodiment lies in: since the main heat sink functions to dissipate heat and can also carry the circuit board, it is unnecessary to additionally set other structure for carrying the circuit board, and it saves cost.

To avoid damage to the heating components 111, in this embodiment, the auxiliary heat sink 122 presses the circuit board 110 against the main heat sink 121 by the way of resilient press. Through such way of press, it can function to fix, and meanwhile, the heating components 111 are not easy to damage since the heating components 111 suffer from a small pressure.

In one embodiment, as shown in FIG. 1, a thermal conductive material 130 is filled in a gap between the auxiliary heat sink 122 and the circuit board 110, and the thermal conductive material 130 is, for example, thermal conductive silicone grease or thermal conductive rubber pad.

In this embodiment, since the auxiliary heat sink 122 presses the circuit board 110 against the main heat sink 121 by the way of resilient press, a gap exists unavoidably between the auxiliary heat sink 122 and the circuit board 110 to affect heat dissipation effect. Considering of such case, thermal conductive silicone grease or thermal conductive rubber pad is filled in the gap between the auxiliary heat sink 122 and the circuit board 110. A heat dissipation area of the circuit board 110 is increased in a disguised form by filling thermal conductive silicone grease or thermal conductive rubber pad in the gap between the auxiliary heat sink 122 and the circuit board 110, thereby further enhancing the heat dissipation effect of the circuit board 110.

The advantageous effect of this embodiment lies in that the heat dissipation effect of the circuit board is further enhanced by filling the thermal conductive material in the gap between the auxiliary heat sink and the circuit board.

In one embodiment, as shown in FIG. 1, since the heat dissipation efficiency of the main heat sink 121 is higher than that of the auxiliary heat sink 122, the main heat sink 121 can be provided corresponding to the second side face 1102 of the circuit board 110, and the auxiliary heat sink 122 can be provided corresponding to the first side face 1101 of the circuit board 110.

Specifically, the main heat sink 121 comprises a first heat dissipation body 1211 comprising a first surface and a second surface opposite to each other, and a first heat dissipation fin 1212 connected to the first surface of the first heat dissipation body 1211, and the second surface of the first heat dissipation body 1211 connected to the second side face 1102 of the circuit board 110. The auxiliary heat sink 122 comprises a second heat dissipation body 1221 comprising a third surface and a fourth surface opposite to each other, and a second heat dissipation fin 1222 connected to the third surface of the second heat dissipation body 1221, and the fourth surface of the second heat dissipation body 1221 connected to the first side face 1101 of the circuit board 110.

Because of the main heat sink and the auxiliary heat sink, heat on two sides of the circuit board is balanced, thereby further balancing heat of respective regions in the heat-dissipation air duct.

Figure 7:
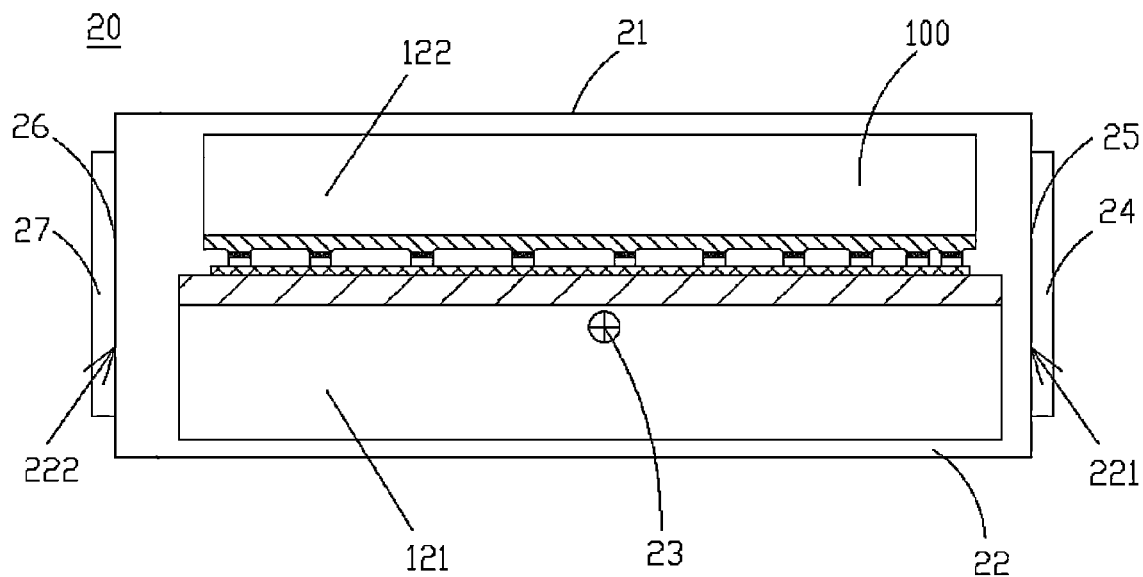
FIG. 7 is a structure diagram of a computing device according to one embodiment of the disclosure.

In one embodiment, as shown in FIG. 7, a computing device 20 comprises a device housing 21 enclosing an enclosed heat-dissipation air duct 22, and the computational heat dissipation structure 100, wherein the computational heat dissipation structure 100 is located in the heat-dissipation air duct 22. The heat-dissipation air duct 22 is mounted with a temperature detecting unit 23 for measuring a temperature in the heat-dissipation air duct 22.

Figure 8:
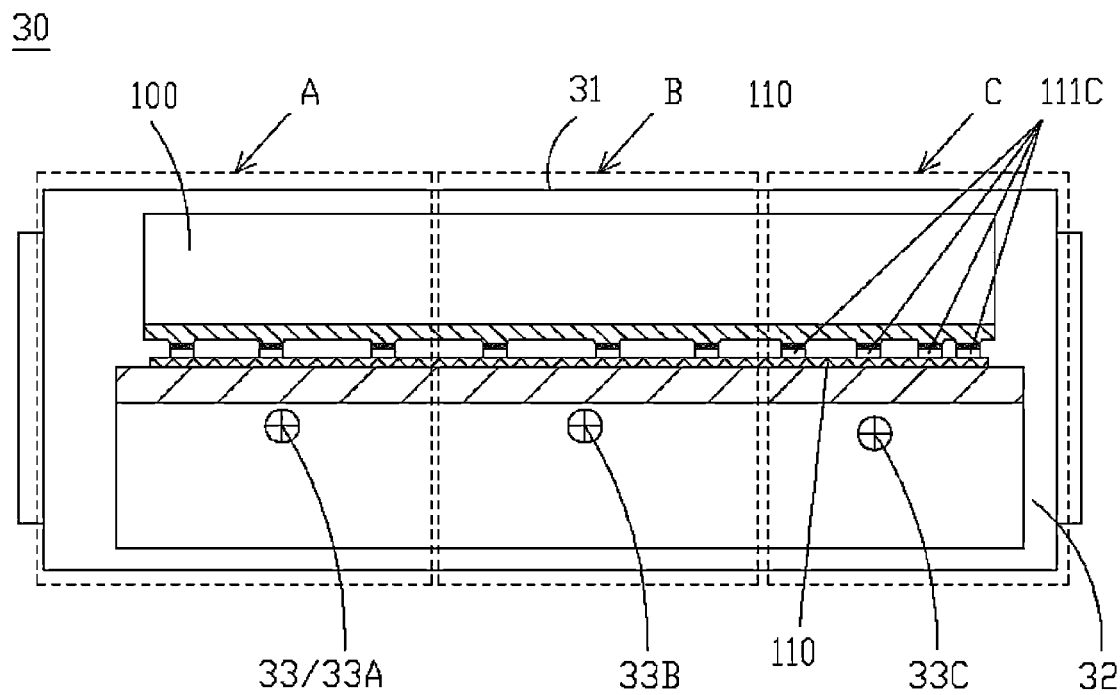
FIG. 8 is a structure diagram of a computing device according to one embodiment of the disclosure.

In one embodiment, as shown in FIG. 8, a computing device 30 comprises a device housing 31 enclosing an enclosed heat-dissipation air duct 32, and the computational heat dissipation structure 100, wherein the computational heat dissipation structure 100 is located in the heat-dissipation air duct 32. The heat-dissipation air duct 32 is mounted with a plurality of temperature detecting units 33 for measuring temperatures in the heat-dissipation air duct 32, and the plurality of temperature detecting units 33 are provided in different regions of the heat-dissipation air duct 32 to real-time detect temperatures of different regions.

In this embodiment, the temperature detecting units are mounted in the heat-dissipation air duct to record temperatures in the heat-dissipation air duct, so that during working of the computing device, the user can acquire the temperatures in the heat-dissipation air duct, and adjusts a rotation speed of the fan.

In one embodiment, as shown in FIG. 7, the computing device 20 further comprises a controller comprising a fan control module and comprises a fan 24, the temperature detecting unit 23 and the fan 24 respectively electrically connected to the fan control module. The fan control module dynamically adjusts a rotation speed of the fan 24 based on the temperature in the heat-dissipation air duct 22 detected by the temperature detecting unit 23, so that the fan 24 is avoided to keep a high rotation speed for a long time, thereby reducing electric energy loss.

In this embodiment, the rotation speed of the fan is automatically adjusted by the fan control module, or manually adjusted by giving an instruction based on the temperature fed back from the temperature detecting unit.

In one embodiment, as shown in FIG. 7, the heat-dissipation air duct 22 comprises an air inlet 221 mounted with a first panel assembly 25, and an air outlet 222 mounted with a second panel assembly 26. The first panel assembly 25 and the second panel assembly 26 fix the radiator 120, i.e., the main heat sink 121 and the auxiliary heat sink 122, within the heat-dissipation air duct 22 in parallel.

The fan 24 is, for example, fixed onto the first panel assembly 25 at the air inlet 221.

In one embodiment, as shown in FIG. 7, the computing device 20 further comprises a fan 27 provided at the air outlet 222, and connected to the second panel assembly 26.

In this embodiment, the computing device 20 is provided with the fan 24 and the fan 27 on both ends. The fan 24 at the air inlet 221 blows air, and the fan 27 at the air outlet absorbs air, so that a faster and more fluent heat dissipation airflow is formed in the heat-dissipation air duct 22, and the heat dissipation effect is further enhanced.

According to the respective embodiments, it shall be noted that the position and the number of fan in the disclosure can be adjusted according to the need. For example, the fan 27 can be provided only at the air outlet 222 to suction out air, the fan 24 can be provided only at the air inlet 221 to blow air, and the fans also can be provided at both the air outlet 222 and the air inlet 221 to enhance airflow, but the disclosure is not limited thereto.

In one embodiment, as shown in FIG. 8, the heat-dissipation air duct 32 is divided into, for example, three temperature zones, which are a first temperature zone A, a second temperature zone B, and a third temperature zone C, respectively. The temperature detecting units are, for example, three, which are the temperature detecting units 33A, 33B and 33C, respectively, and the temperature detecting units 33A, 33B and 33C respectively detect temperatures of the first temperature zone A, the second temperature zone B, and the third temperature zone C of the heat-dissipation air duct 32. Of course, each temperature zone can also correspond to more than one temperature detecting unit.

The first temperature zone A, the second temperature zone B, and the third temperature zone C correspond to a part of the heating components on the circuit board 110, respectively.

The controller of the computing device 30 further comprises a chip control module electrically connected to the temperature detecting units 33A, 33B and 33C, wherein the chip control module adjusts dynamically working frequencies of the heating components in the temperature zones where the temperature detecting units 33A, 33B and 33C are located based on the temperatures of different temperature zones A, B and C in the heat-dissipation air duct 32 detected by the temperature detecting units 33A, 33B and 33C.

For example, when the temperature of the third temperature zone C detected by the temperature detecting unit 33C is too high, the chip control module controls a part of the heating components 111C corresponding to the third temperature zone C to reduce the working frequencies, so as to decrease the heat of this part of the heating components 111C, and balance the heat dissipation efficiencies of respective heating components.

In this embodiment, life of the heating components can be prolonged, and problems of too much noise due to long-time overload working of the fan, and overall working efficiency affected by damage of the fan and the circuit can be avoided by reducing the working efficiencies of a part of the heating components in an overheating region.

Figure 9:
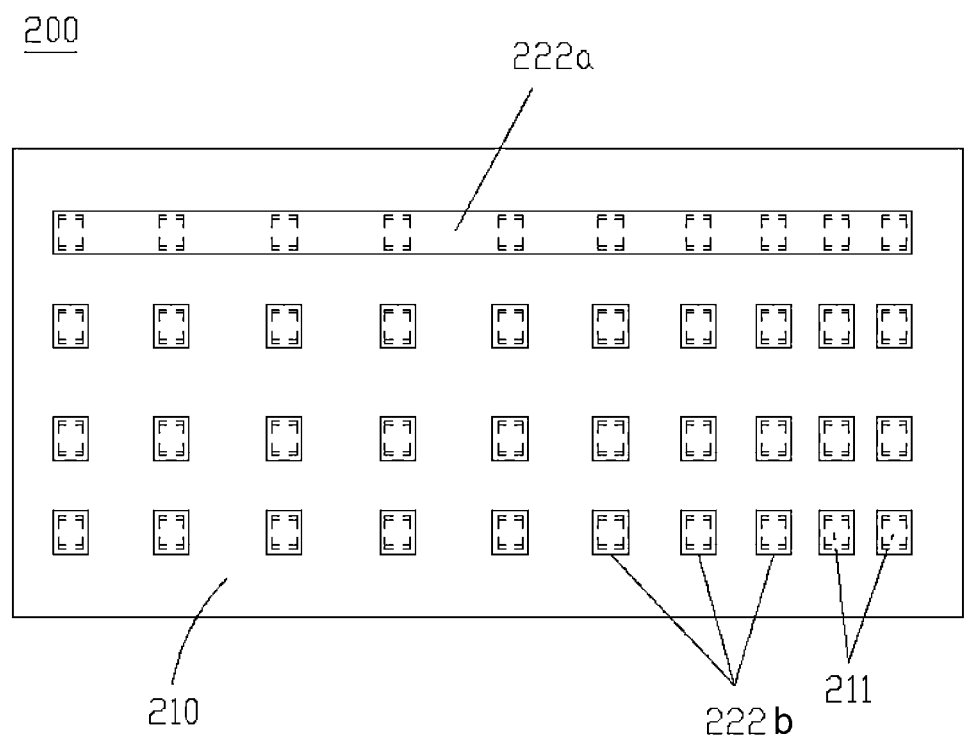
FIG. 9 is a structure diagram of a computational heat dissipation structure according to one embodiment of the disclosure.

FIG. 9 is a structure diagram of a computational heat dissipation structure according to one embodiment of the disclosure. In one embodiment, as shown in FIG. 9, the computational heat dissipation structure 200 comprises a circuit board 210 and a radiator. The circuit board 210 is provided with a plurality of heating components 211, which are unequally spaced, and a space between the adjacent heating components 211 is negatively correlated with heat dissipation efficiency of a region where the adjacent heating components 211 are located.

The radiator comprises a main heat sink (not shown) and an auxiliary heat sink provided on two side faces of the circuit board 210 respectively. For example, there may be a plurality of auxiliary heat sinks 222b, each being provided corresponding to one of the heating components 211. Of course, each auxiliary heat sink 222a may also be provided corresponding to more of the heating components 211. It shall be noted that in different embodiments, the number of circuit board 210 may be one or more, but the disclosure is not limited thereto.

Figure 10:
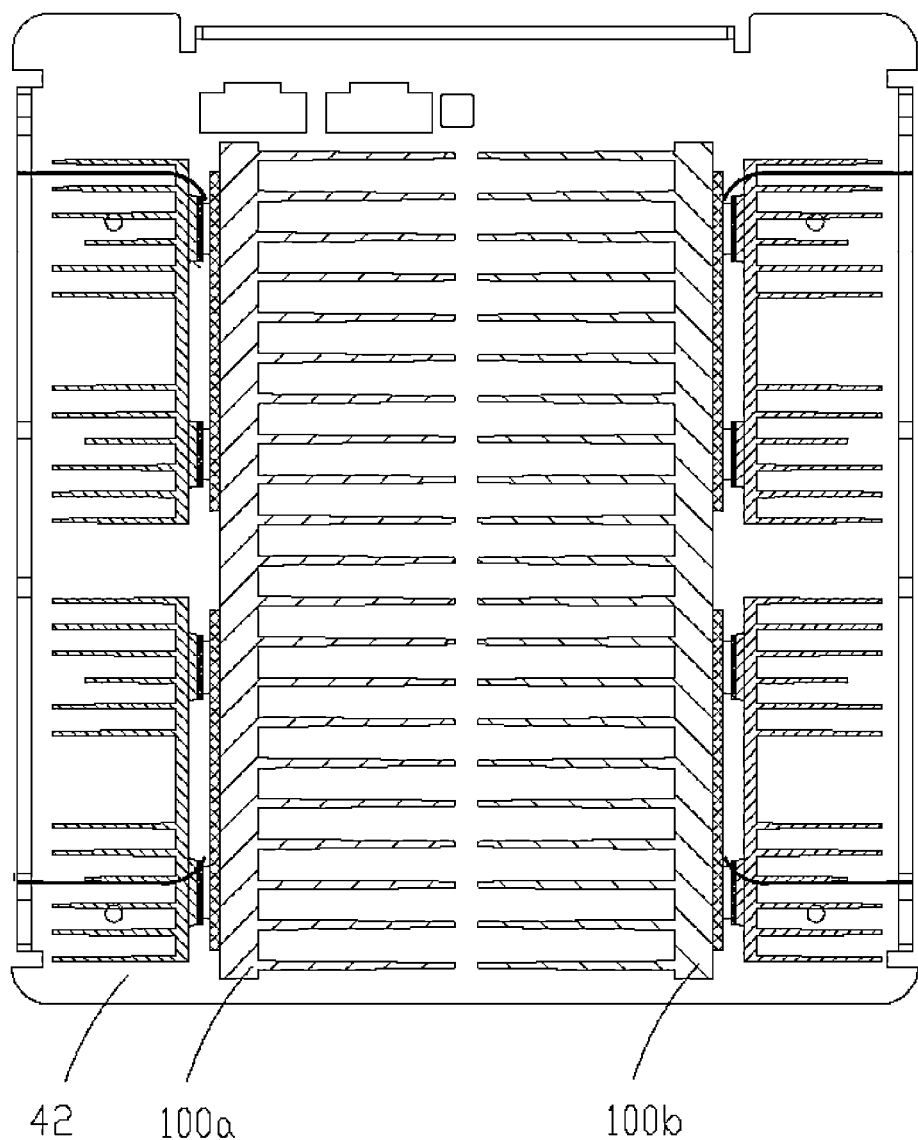
FIG. 10 is a structure diagram of a computing device according to one embodiment of the disclosure.

According to the disclosure, there may be only one computational heat dissipation structure in the heat-dissipation air duct as the computing device shown in FIGS. 1, 7 and 8, and alternatively there may be two computational heat dissipation structures 100a and 110b in a heat-dissipation air duct 42 as a computing device 40 shown in FIG. 10, wherein the computational heat dissipation structures 100a and 110b are symmetrically provided. Of course, more computational heat dissipation structures can also be included.

The computing device of the disclosure can be a computing device for a virtual coin mining machine, and a mine in the disclosure refers to a place where a large number of mining machines are gathered for virtual coin mining.

Figure 11:
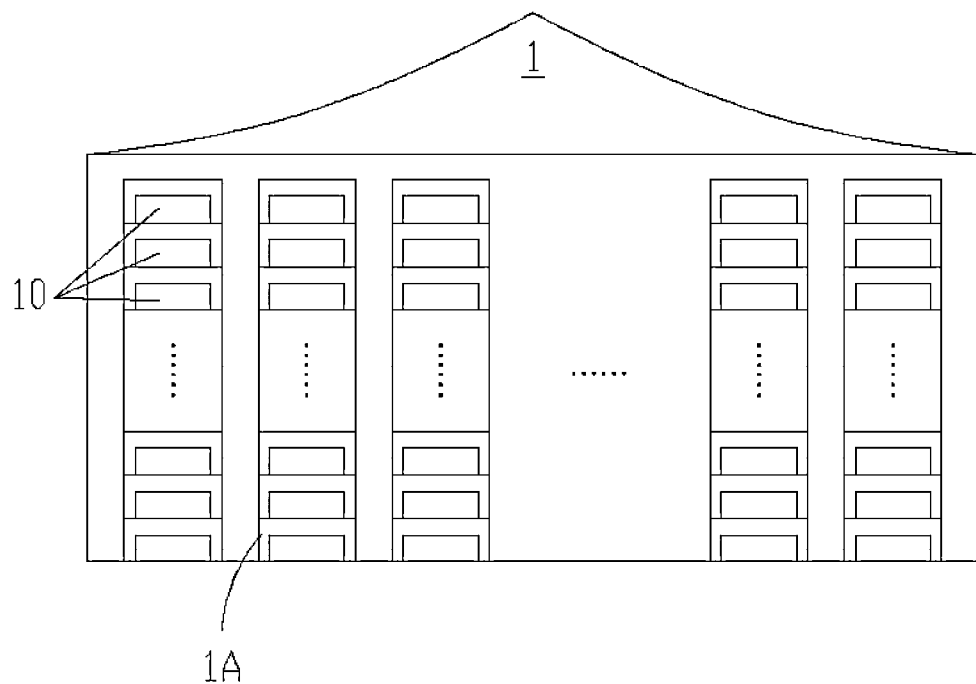
FIG. 11 is a structure diagram of a mine according to one embodiment of the disclosure.

The structure of the mine in one embodiment of the disclosure is shown in FIG. 11. The mine 1 comprises at least one setting frame 1A provided with at least one computing device of the disclosure, for example, the computing device 10. It shall be noted that the setting frame 1A can have computing devices in various ways, for example, parallel and stack, and the structure and the form of the setting frame 1A are not limited to the figures.

Of course, the disclosure also can have other various embodiments, and those skilled in the art can make various corresponding modifications and variations based on the disclosure without departing from spirit and essence of the disclosure, but these corresponding modifications and variations shall belong to the scope protected by the appended claims of the disclosure.

INDUSTRIAL APPLICABILITY

Since the space between the adjacent heating components is negatively correlated with the heat dissipation efficiency of the region where the adjacent heating components are located, i.e., the higher the heat dissipation efficiency of the region where the adjacent heating components are located is, the smaller the space between the adjacent heating components in the region will be, the computational heat dissipation structure and the computing device provided by the disclosure balance the heat dissipation efficiencies of respective heating components, and reduce load of the fan. Therefore, the mine provided by the disclosure avoids the problem of overheating damage of the heating components even if a large number of computing devices are gathered in the same space.

What is claimed is:

1. A circuit board, comprising a plurality of heat-generating components, wherein a spacing between adjacent heat-generating components of the plurality of heat-generating components is negatively correlated with a heat dissipation efficiency of a region where the adjacent heat-generating components are located, wherein:
the plurality of heat-generating components comprise at least one row of heat-generating components along a direction of airflow; and
along the direction of airflow, average spacing among first three of the at least one row of heat-generating components is smaller than average spacing among last three of the at least one row of heat-generating components.

2. The circuit board of claim 1, wherein:
along the direction of airflow, spacing of at least three pairs of adjacent heat-generating components among the at least one row of heat-generating components are different.

3. The circuit board of claim 1, wherein:
the plurality of heat-generating components comprises twenty or more heat-generating components; and
at least some of the plurality of heat-generating components are symmetrically distributed with respect to an axis parallel to a direction of airflow.

4. The circuit board of claim 1, wherein:
the circuit board is disposed in a heat-dissipation air duct; and
a direction of airflow is a direction from an air inlet of the heat-dissipation air duct to an air outlet of the heat-dissipation air duct.

5. The circuit board of claim 1, wherein:
the plurality of heat-generating components have identical sizes; or
heat-generating areas of the plurality of heat-generating components are identical.

6. The circuit board of claim 1, wherein:
the plurality of heat-generating components are distributed in rows, and in each of the rows, centers of at least three heat-generating components are distributed along a line; or
the plurality of heat-generating components are distributed in columns, and in each of the columns, centers of at least three heat-generating components are distributed along a line.

7. The circuit board of claim 6, wherein for at least one of the rows, spacing of at least two adjacent heat-generating components of the at least one row is negatively correlated with a heat dissipation efficiency of a region where the adjacent heat-generating components of the at least one row are located.

8. The circuit board of claim 6, wherein:
the circuit board is disposed in a heat-dissipation air duct;
the heat-dissipation air duct comprises an air inlet; and
for at least one of the rows, spacing of at least two adjacent heat-generating components of the at least one row is positively correlated with a distance from the air inlet to the at least two adjacent heat-generating components of the at least one row.

9. The circuit board of claim 6, wherein:
the circuit board is disposed in a heat-dissipation air duct;
the heat-dissipation air duct comprises an air inlet and an air outlet; and
for at least one of the rows, spacing of adjacent heat-generating components of the at least one row closer to the air inlet is smaller than spacing of adjacent heat-generating components of the at least one row closer to the air outlet.

10. The circuit board of claim 6, wherein:
the plurality of heat-generating components are distributed in an even number of rows; and
a direction along each of the rows is in parallel with a direction from an air inlet of a heat-dissipation air duct to an air outlet of the heat-dissipation air duct.

11. The circuit board of claim 6, wherein:
the circuit board is disposed in a heat-dissipation air duct;
the heat-dissipation air duct comprises an air inlet and an air outlet;
a direction along each of the rows is in parallel with a direction from the air inlet to the air outlet; and a direction along each of the columns is perpendicular to the direction along each of the rows.

12. The circuit board of claim 11, wherein:
along the direction from the air inlet to the air outlet, average spacing among adjacent heat-generating components of first three columns of the plurality of heat-generating components is smaller than average spacing among adjacent heat-generating components of last three columns of the plurality of heat-generating components; or
along the direction from the air inlet to the air outlet, a length of first three columns of the plurality of heat-generating components is smaller than a length of last three columns of the plurality of heat-generating components, wherein the length is a dimension parallel to the direction from the air inlet to the air outlet and parallel to a plane of the circuit board.

13. The circuit board of claim 11, wherein:
at least one of the rows comprises a first heat-generating component and a second heat-generating component disposed along the direction from the air inlet to the air outlet;
the first heat-generating component is closest to the air inlet among the at least one row of heat-generating components;
the second heat-generating component is second closest to the air inlet among the at least one row of heat-generating components; and
spacing between the first heat-generating component and the second heat-generating component is smaller than a distance between the first heat-generating component and an edge of the circuit board closest to the air inlet.

14. The circuit board of claim 11, wherein:
at least one of the rows comprises a first heat-generating component and a last heat-generating component disposed along the direction from the air inlet to the air outlet;
the first heat-generating component is closest to the air inlet among the at least one row of heat-generating components;
the last heat-generating component is closest to the air outlet among the at least one row of heat-generating components; and
a distance between the first heat-generating component and an edge of the circuit board closest to the air inlet is smaller than a distance between the last heat-generating component and an edge of the circuit board closest to the air outlet.

15. The circuit board of claim 11, wherein:
the at least one rows is disposed between a first edge and a second edge of the circuit board;
the rows comprise a first row closest to the first edge and a second row closest to the second edge; and
a distance between the first row to the first edge is substantially same as a distance between the second row to the second edge.

16. The circuit board of claim 11, wherein:
a number of heat-generating components of each of the rows is larger than a number of heat-generating components of each of the columns; or
the number of heat-generating components of each of the rows is more than twice the number of heat-generating components of each of the columns.

17. The circuit board of claim 1, wherein:
the circuit board is disposed in a heat-dissipation air duct;
the circuit board comprises a first edge and a second edge both in parallel with a direction from an air inlet of the heat-dissipation air duct to an air outlet of the heat-dissipation air duct;
the plurality of heat-generating components are distributed in rows between the first edge and the second edge;
the rows comprise a first row and a second row;
the first row and the second row are closer to the first edge than the second edge;
the first row is closer to the first edge than the second row; and
in a working state, an average temperature of heat-generating components of the first row excluding a first heat-generating component closest to the air inlet of the heat-dissipation air duct among the first row is smaller than an average temperature of heat-generating components of the second row excluding a different first heat-generating component closest to the air inlet of the heat-dissipation air duct among the second row.

18. The circuit board of claim 1, wherein:
the circuit board is disposed in a heat-dissipation air duct;
the circuit board comprises a first edge and a second edge both in parallel with a direction from an air inlet of the heat-dissipation air duct to an air outlet of the heat-dissipation air duct;
the plurality of heat-generating components are distributed in rows between the first edge and the second edge;
the rows comprise a first row and a second row;
the first row and the second row are closer to the first edge than the second edge;
the first row is closer to the first edge than the second row; and
in a working state, an average temperature of heat-generating components of the first row is smaller than an average temperature of heat-generating components of the second row.

19. The circuit board of claim 1, wherein, along a direction of heat-dissipation, the spacing between adjacent heat-generating components of the plurality of heat-generating components is negatively correlated with the heat dissipation efficiency of the region where the adjacent heat-generating components are located.

20. The circuit board of claim 1, comprising two parallel long edges and two parallel short edges, wherein:
each of the long edges is longer than each of the short edges;
the plurality of heat-generating components comprise one or more first lines of heat-generating components distributed along the long edges;
the plurality of heat-generating components comprise one or more second lines of heat-generating components distributed along the short edges; and
a number of heat-generating components in each of the one or more first lines is more than a number of heat-generating components in each of the one or more second lines.

21. A heat dissipation structure, comprising a plurality of heat-generating components, wherein a spacing between adjacent heat-generating components of the plurality of heat-generating components is negatively correlated with a heat dissipation efficiency of a region where the adjacent heat-generating components are located, wherein:

the plurality of heat-generating components comprise at least one row of heat-generating components along a direction of airflow; and along the direction of airflow, average spacing among first three of the at least one row of heat-generating components is smaller than average spacing among last three of the at least one row of heat-generating components.

22. The heat dissipation structure of claim 21, comprising a circuit board and at least one radiator, wherein:
the circuit board comprises the plurality of heat-generating components; and
the at least one radiator is disposed on a first side surface or a second side surface or both the first side surface and the second side surface of the circuit board.

23. The heat dissipation structure of claim 22, wherein:
the heat dissipation structure is disposed in a heat-dissipation air duct;
the at least one radiator comprises a heat sink;
the heat sink comprises a heat dissipation body and a plurality of heat dissipation fins;
the plurality of heat dissipation fins are connected with a first surface of the heat dissipation body;
a second surface of the heat dissipation body is disposed on the first side surface of the circuit board;
the plurality of heat dissipation fins are evenly spaced or have a uniform thickness; and
the thickness is a dimension along a direction parallel to a plane of the circuit board and normal to a direction from an air inlet to an air outlet of the heat-dissipation air duct.

24. The heat dissipation structure of claim 22, wherein:
the heat dissipation structure is disposed in a heat-dissipation air duct;
the at least one radiator comprises a heat sink;
the heat sink comprises a heat dissipation body and a plurality of heat dissipation fins;
the plurality of heat dissipation fins are connected with a third surface of the heat dissipation body;
a fourth surface of the heat dissipation body is disposed on the side surface of the circuit board; and
the plurality of heat dissipation fins are evenly spaced, or
the plurality of heat dissipation fins have a uniform thickness, wherein the thickness is a dimension along a direction parallel to a plane of the circuit board and normal to a direction from an air inlet of the heat-dissipation air duct to an air outlet of the heat-dissipation air duct, or
the plurality of heat dissipation fins have a uniform length, wherein the length is a dimension along a direction normal to a plane of the circuit board, or along the direction from the air inlet of the heat-dissipation air duct to the air outlet of the heat-dissipation air duct, the uniform length of the plurality of heat dissipation fins is unchanged.

25. The heat dissipation structure of claim 22, wherein:
the heat dissipation structure is disposed in a heat-dissipation air duct;
the at least one radiator comprises a first heat sink;
the first heat sink comprises a first heat dissipation body and a plurality of first heat dissipation fins; the plurality of first heat dissipation fins are connected with a first surface of the first heat dissipation body;
a second surface of the first heat dissipation body is disposed on the first side surface of the circuit board; and
the first heat sink is configured to carry the circuit board.

26. The heat dissipation structure of claim 25, wherein:
other than the first heat sink, the heat dissipation structure comprises no component configured to carry the circuit board.

27. The heat dissipation structure of claim 25, wherein:
the first heat sink is configured to support the heat-dissipation air duct.

28. The heat dissipation structure of claim 22, wherein:
the at least one radiator comprises a first heat sink and a second heat sink;
the first heat sink comprises a first heat dissipation body and a plurality of first heat dissipation fins;
the plurality of first heat dissipation fins are connected with a first surface of the first heat dissipation body;
a second surface of the first heat dissipation body is disposed on the first side surface of the circuit board;
the second heat sink comprises a second heat dissipation body and a plurality of second heat dissipation fins;
the plurality of second heat dissipation fins are connected with a third surface of the second heat dissipation body;
a fourth surface of the second heat dissipation body is disposed on the second side surface of the circuit board; and
a length of the first heat dissipation body is larger than a length of the second heat dissipation body, wherein the length is a dimension parallel to a direction from an air inlet to an air outlet of a heat-dissipation air duct and parallel to a plane of the circuit board.

29. The heat dissipation structure of claim 22, wherein:
the at least one radiator comprises a first heat sink and a second heat sink;
the first heat sink comprises a first heat dissipation body and a plurality of first heat dissipation fins;
the plurality of first heat dissipation fins are connected with a first surface of the first heat dissipation body;
a second surface of the first heat dissipation body is disposed on the first side surface of the circuit board;
the second heat sink comprises a second heat dissipation body and a plurality of second heat dissipation fins;
the plurality of second heat dissipation fins are connected with a third surface of the second heat dissipation body; and
a fourth surface of the second heat dissipation body is disposed on the second side surface of the circuit board.

30. The heat dissipation structure of claim 29, wherein:
the heat dissipation structure is disposed in a heat-dissipation air duct;
a length of the first heat dissipation body is larger than a length of the circuit board; and
each of the length of the first heat dissipation body and the length of the circuit board is a dimension along a direction parallel to a plane of the circuit board and normal to a direction from an air inlet to an air outlet of the heat-dissipation air duct.

31. The heat dissipation structure of claim 29, wherein:
the heat dissipation structure is disposed in a heat-dissipation air duct;
a thickness of the first heat dissipation body is larger than a thickness of the second heat dissipation body; and
each of the thickness of the first heat dissipation body and the thickness of the second heat dissipation body is a dimension along a direction normal to a plane of the circuit board and normal to a direction from an air inlet to an air outlet of the heat-dissipation air duct.

32. The heat dissipation structure of claim 29, wherein:
the heat dissipation structure is disposed in a heat-dissipation air duct;

a length of the first heat dissipation body is different from a length of the second heat dissipation body; and each of the length of the first heat dissipation body and the length of the second heat dissipation body is a dimension along a direction parallel to a plane of the circuit board and normal to a direction from an air inlet to an air outlet of the heat-dissipation air duct.

33. The heat dissipation structure of claim 32, wherein:

the length of the first heat dissipation body is larger than the length of the second heat dissipation body.

34. The heat dissipation structure of claim 29, wherein:

the heat dissipation structure is disposed in a heat-dissipation air duct;

a length of each of the plurality of first heat dissipation fins is larger than a length of each of the plurality of second heat dissipation fins; and each of the length of each of the plurality of first heat dissipation fins and the length of each of the plurality of second heat dissipation fins is a dimension along a direction normal to a plane of the circuit board.

35. The heat dissipation structure of claim 29, wherein:

a thickness of each of the plurality of first heat dissipation fins is different from a thickness of each of the plurality of second heat dissipation fins; or spacing between adjacent fins of the plurality of first heat dissipation fins is different from spacing between adjacent fins of the plurality of second heat dissipation fins.

36. The heat dissipation structure of claim 22, wherein:

no heat-generating component is disposed on the first side surface; or the plurality of heat-generating components are disposed on the second side surface.

37. The heat dissipation structure of claim 22, wherein:

the at least one radiator comprises a first heat sink and a second heat sink; and a heat dissipation efficiency of the first heat sink is larger than a heat dissipation efficiency of the second heat sink.

38. The heat dissipation structure of claim 22, wherein:

when the circuit board is in a working state, an amount of heat outputted from the first side surface is larger than an amount of heat outputted from the second side surface.

39. The heat dissipation structure of claim 22, wherein:

the at least one radiator comprises a second heat sink; and a gap between the second heat sink and the circuit board is filled with thermal conductive silicone grease or thermal conductive rubber pad.

40. The heat dissipation structure of claim 22, wherein:

the at least one radiator comprises a first heat sink and a second heat sink; and the second heat sink is configured to press the circuit board against the first heat sink.

41. The heat dissipation structure of claim 22, wherein:

the at least one radiator comprises a second heat sink; and the second heat sink comprises at least two bulges disposed on at least some of the plurality of heat-generating components.

42. The heat dissipation structure of claim 41, wherein each of the plurality of heat-generating components is in contact with one of the at least two bulges.

43. The heat dissipation structure of claim 41, wherein:

the circuit board and the second heat sink are disposed in a heat-dissipation air duct;

the plurality of heat-generating components are distributed in rows each along a direction from an air inlet to an air outlet of the heat-dissipation air duct; and each of the rows is in contact with one of the at least two bulges.

44. A computing device, comprising:

a plurality of heat-generating components, wherein a spacing between adjacent heat-generating components of the plurality of heat-generating components is negatively correlated with a heat dissipation efficiency of a region where the adjacent heat-generating components are located; and a heat dissipation structure and a housing enclosing a heat-dissipation air duct, wherein:

the heat dissipation structure comprises a circuit board and at least one radiator, the circuit board comprises the plurality of heat-generating components;

the at least one radiator is disposed on a first side surface or a second side surface or both the first side surface and the second side surface of the circuit board;

the at least one radiator comprises a first heat sink and a second heat sink, the second heat sink configured to press the circuit board against the first heat sink.

45. The computing device of claim 44, wherein: the heat dissipation structure is disposed in the heat-dissipation air duct.

46. The computing device of claim 44, wherein:

the housing comprises a panel assembly and a different panel assembly; and the panel assembly and the different panel assembly are configured to fix the first heat sink and the second heat sink in parallel inside the heat-dissipation air duct.

47. The computing device of claim 44, wherein:

the housing comprises a panel assembly and a different panel assembly; and the panel assembly and the different panel assembly are normal to a plane of the circuit board.

48. The computing device of claim 44, wherein:

the first heat sink comprises a plurality of first heat dissipation fins;

the second heat sink comprises a plurality of second heat dissipation fins;

the housing comprises a panel assembly and a different panel assembly; and the panel assembly and the different panel assembly are in parallel to the plurality of first heat dissipation fins and the plurality of second heat dissipation fins.

49. The computing device of claim 44, wherein:

a shortest distance between the heat dissipation structure and a bottom surface of the housing is smaller than a length of each of the plurality of heat-generating components; or a shortest distance between the heat dissipation structure and a side surface of the housing is smaller than the length of each of the plurality of heat-generating components.

50. The computing device of claim 44, wherein:

a smallest distance between a heat sink of the heat dissipation structure and a bottom of the housing is less than a length or width of each of the plurality of heat-generating components; or a smallest distance between a heat dissipation body of a heat sink of the heat dissipation structure and the bottom of the housing is less than the length or width of each of the plurality of heat-generating components.

51. The computing device of claim 44, wherein:

a space forms between the heat dissipation structure and a top surface of the housing, a height of the space is a dimension along a direction parallel to a plane of the circuit board and normal to a direction from an air inlet to an air outlet of the heat-dissipation air duct; and the height of the space is smaller than a length of a first heat dissipation body of the first heat sink of the at least one radiator, wherein the length of the first heat dissipation body is a dimension along a direction parallel to a plane of the circuit board and normal to the direction from the air inlet to the air outlet of the heat-dissipation air duct, or the height of the space is smaller than a length of a second heat dissipation body of the second heat sink of the at least one radiator, wherein the length of the second heat dissipation body is the dimension along the direction parallel to a plane of the circuit board and normal to the direction from the air inlet to the air outlet of the heat-dissipation air duct, or the height of the space is smaller than a length of each of a plurality of first heat dissipation fins or larger than a length of each of a plurality of second heat dissipation fins, wherein each of the length of the plurality of first heat dissipation fins and the length of the plurality of second heat dissipation fins is a dimension along a direction normal to the plane of the circuit board.

52. The computing device of claim 44, wherein:
at least one temperature detector is disposed in the heat-dissipation air duct and configured to measure at least one temperature in the heat-dissipation air duct;
the heat-dissipation air duct is provided with at least one fan;
the at least one temperature detector and the at least one fan are coupled to a controller; and
the controller is configured to monitor the at least one temperature and control a rotation speed of the at least one fan based on the at least one temperature.

53. The computing device of claim 44, wherein:
the heat-dissipation air duct comprises an air inlet and an air outlet; and
the computing device further comprises a first panel assembly disposed at the air inlet and a second panel assembly disposed at the air outlet.

54. The computing device of claim 44, wherein:
the heat dissipation structure is in connection with a space between the heat dissipation structure and a top surface of the housing.

55. A mine, comprising at least one frame provided with at least one computing device, wherein the at least one computing device is the computing device of claim 44.

* * * * *